(12) United States Patent
Itakura et al.

(10) Patent No.: US 7,468,880 B2
(45) Date of Patent: Dec. 23, 2008

(54) ELECTROSTATIC CHUCK

(75) Inventors: Ikuo Itakura, Fukuoka (JP); Syouichiro Himuro, Fukuoka (JP)

(73) Assignee: Toto Ltd., Fukuoka (JP)

( * ) Notice: Subject to any disclaimer, the term of this patent is extended or adjusted under 35 U.S.C. 154(b) by 176 days.

(21) Appl. No.: 11/299,802

(22) Filed: Dec. 13, 2005

(65) Prior Publication Data

US 2006/0268491 A1    Nov. 30, 2006

(30) Foreign Application Priority Data

May 24, 2005    (JP)    ............... 2005-151483

(51) Int. Cl.
H02N 13/00    (2006.01)
(52) U.S. Cl. .................................... 361/234
(58) Field of Classification Search .................. 361/234
See application file for complete search history.

(56) References Cited

U.S. PATENT DOCUMENTS 4,542,401 A * 9/1985 Sekiba ....................... 257/717
5,909,354 A     6/1999 Harada et al.

FOREIGN PATENT DOCUMENTS

| JP | 60-096832 | 7/1985 |
|---|---|---|
| JP | 62-264638 | 11/1987 |
| JP | 63-283037 | 11/1988 |
| JP | 01-240243 | 9/1989 |
| JP | 04-133443 | 12/1992 |
| JP | 4-133443 U | 12/1992 |
| JP | 09-134951 | 5/1997 |
| JP | 09-148420 | 6/1997 |
| JP | 10-154745 | 6/1998 |
| JP | 10-223742 A | 8/1998 |
| JP | 10-261697 | 9/1998 |
| JP | 11-233604 | 8/1999 |
| JP | 11-265930 | 9/1999 |
| JP | 2001-060619 | 3/2001 |
| JP | 2001-284328 | 10/2001 |
| JP | 2001-313331 | 11/2001 |
| JP | 2001-338970 A | 12/2001 |
| JP | 2002-093896 | 3/2002 |
| JP | 2002-324834 | 11/2002 |
| JP | 2003-037158 | 2/2003 |
| JP | 2003-152065 A | 5/2003 |
| JP | 2003-168725 | 6/2003 |
| JP | 2004-168609 | 6/2004 |
| JP | 2004-200462 | 7/2004 |
| JP | 2004-235563 | 8/2004 |
| JP | 2004-241668 | 8/2004 |
| JP | 2005-057234 | 3/2005 |

\* cited by examiner

*Primary Examiner*—Ronald W Leja
(74) *Attorney, Agent, or Firm*—Carrier, Blackman & Associates, P.C.; Joseph P. Carrier; William D. Blackman

(57) ABSTRACT

The object of the present invention is to provide an electrostatic chuck which has high plasma resistance and high capability of cooling a material to be clamped. As for the basic structure of the electrostatic chuck, an insulating film is formed on a surface of a metal plate by flame spraying, and a dielectric substrate is bonded onto the insulating film by an insulating adhesive layer. The top surface of the dielectric substrate is a surface for mounting a material to be clamped W such as a semiconductor wafer. Electrodes are formed on the lower surface of the dielectric substrate.

16 Claims, 3 Drawing Sheets

PRIOR ART

PRIOR ART

ELECTROSTATIC CHUCK

BACKGROUND OF THE INVENTION

1. Field of the Invention

The present invention relates to an electrostatic chuck for clamping a semiconductor substrate, a glass substrate, or the like.

2. Description of Prior Art

An electrostatic chuck as shown in Documents 1-4 has been used as a means for clamping and retaining a semiconductor substrate or a glass substrate within a plasma processing chamber where etching, CVD, sputtering, ion implantation, ashing, or the like are performed.

The conventional electrostatic chuck as shown in Documents 1-2 has a structure where a dielectric layer 103 having an electrode 102 inside is attached in an integrated manner onto a metal plate 100 by using an organic adhesive 101 such as a silicone resin. As a method for placing the electrode 102 inside the dielectric layer 103, an electrode (tungsten) is printed on a surface of a ceramic green sheet which becomes a dielectric layer after being fired, and another ceramic green sheet is laminated thereon and fired (hot pressing).

Document 1: Japanese Utility-Model Application Publication No. 4-133443

Document 2: Japanese Patent Application Publication No. 10-223742

Document 3: Japanese Patent Application Publication No. 2003-152065

Document 4: Japanese Patent Application Publication No. 2001-338970

Residue and product material from a semiconductor wafer or a coating film attach to the inner surface of the chamber after plasma processing is performed. Further, as plasma processing is repeated, the residue and product material are gradually accumulated, and finally break off from the inner surface of the chamber. They attach to a surface of a semiconductor substrate or a glass substrate, which results in deterioration of the yield.

Thus, according to the conventional art, the inside of the chamber is regularly cleaned by plasma so as to remove the residue and product material attaching to the inner surface of the chamber. In this instance, according to the conventional art, in order to prevent a surface of the electrostatic chuck from being exposed to plasma, cleaning is performed in a state where the surface of the electrostatic chuck is covered with a dummy wafer. However, these days, a surface of an electrostatic chuck is directly exposed to cleaning plasma such as $O_2$ gas or $CF_4$ gas without covering the surface of the electrostatic chuck with a dummy wafer so as to reduce the tact time and improve the production efficiency. This is referred to as waferless plasma cleaning, and this is the recent trend of the industry.

The average grain size of an electrostatic chuck made of common ceramic ingredient powder is 5-50 μm after being fired. If such an electrostatic chuck undergoes the above-mentioned waferless plasma cleaning, the average roughness (Ra) is increased due to release of grains from the surface of the electrostatic chuck and corrosion of the boundary, which results in deterioration of the electrostatic clamping force and deterioration of the heat transfer coefficient at the solid contact boundary face. Consequently, the electrostatic chuck needs to be replaced early.

In order to solve the above-mentioned problems, Document 3 has disclosed an electrostatic chuck in which the average size of the ceramic is reduced to be 2 μm or less. However, in order to incorporate an electrode inside a dielectric layer, a conventional electrostatic chuck requires technically high and complicated processes for integrating two dielectric substrates in a state where an electrode material is interposed therebetween by heat and pressure processing such as hot pressing after the two dielectric substrates are fired and formed. Consequently, there are drawbacks that the reliability is deteriorated and the processing time is increased.

The above-mentioned ceramic dielectric substrate in which the average grain size is reduced to be 2 μm or less cannot be obtained by firing laminated green sheets in a state where an electrode is interposed therebetween because there is a problem with removing a binder at the time of firing. Specifically, in order to produce a conventional electrostatic chuck having plasma-resistance, a technique for incorporating an electrode inside a dielectric layer substrate which has been fired is required.

In order to solve the above-mentioned problem, Document 4 has disclosed a method comprising the steps of forming an electrode on a surface of a dielectric layer substrate, attaching an insulating resin such as polyimide thereonto, and bonding it to a metal base plate. However, this structure has drawbacks of increase of the wafer temperature due to the low heat transfer coefficient of the insulating resin, and the reliability of the insulation.

The object of the present invention is to provide an electrostatic chuck which can be manufactured by a simple process, and has high resistance to waferless plasma cleaning, high capability of cooling a wafer, and high reliability of electrical insulation between the electrode and the metal plate so as to solve all the problems mentioned above.

SUMMARY OF THE INVENTION

In order to achieve the above-mentioned object, according to the present invention, there is provided an electrostatic chuck comprising a metal plate, an insulating film which is formed on a surface of the metal plate by flame spraying, a dielectric substrate, and an electrode which is formed on a surface of the dielectric substrate, wherein the metal plate and the dielectric substrate are bonded to each other by an insulating adhesive such that the insulating film and the electrode are opposed.

With this, even in a case where the electrode is formed on a surface of the dielectric substrate, by forming the insulating film on a surface of the metal plate by flame spraying, it is possible to provide an electrostatic chuck which can undergo waferless plasma cleaning, and also has a simple structure and high reliability.

As for grains of the dielectric substrate, the average size thereof is preferably 2 μm or less so as to improve the plasma-resistance. With the average grain size of 2 μm or less, it is possible to provide an electrostatic chuck in which the roughness of the clamping surface of the dielectric substrate is not changed so much after waferless cleaning is repeated.

The total thickness of the dielectric substrate, the insulating adhesive, and the insulating film is preferably in the range of 0.5-2.0 mm. With this thickness, it is possible to achieve electrical insulation between a material to be clamped and the electrode and between the electrode and the metal plate. It is also possible to provide an electrostatic chuck having good heat-transfer efficiency from a material to be clamped toward the metal plate. More preferably, the total thickness of the dielectric substrate, the insulating adhesive, and the insulating film is 1.5 mm or less so as to control the impedance between a material to be clamped and the metal plate.

DETAILED DESCRIPTION OF PREFERRED EMBODIMENTS

Figure 1:
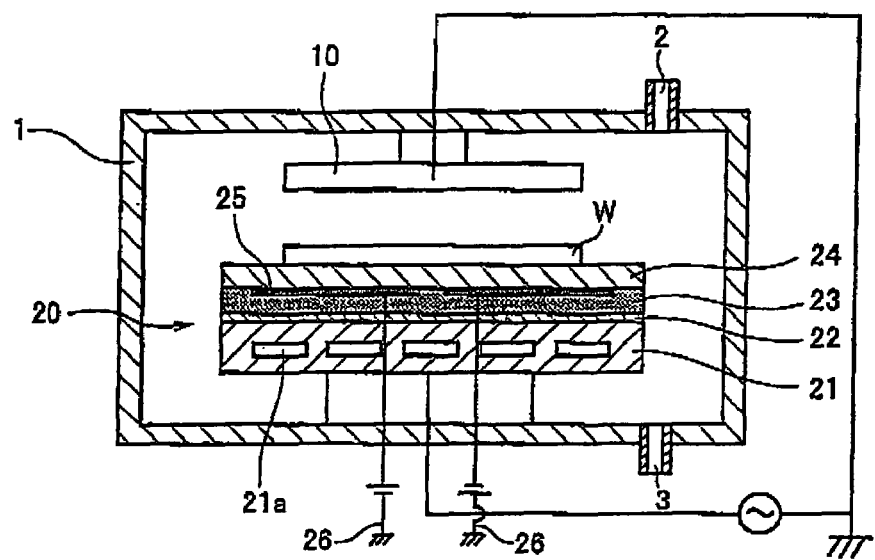
FIG. 1 is a whole view of a plasma processing apparatus in which an electrostatic chuck according to the present invention is incorporated.
Figure 2:
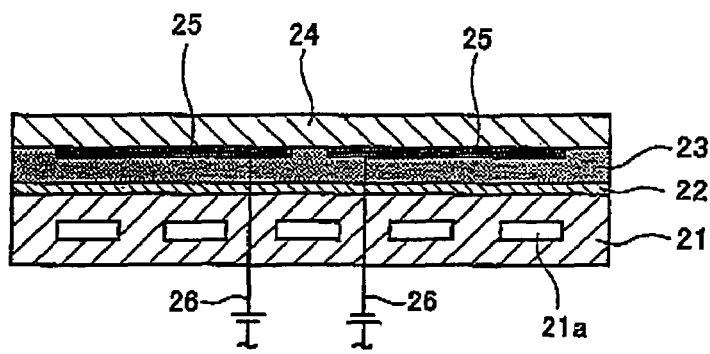
FIG. 2 is a cross-sectional view of the electrostatic chuck.
Figure 3:
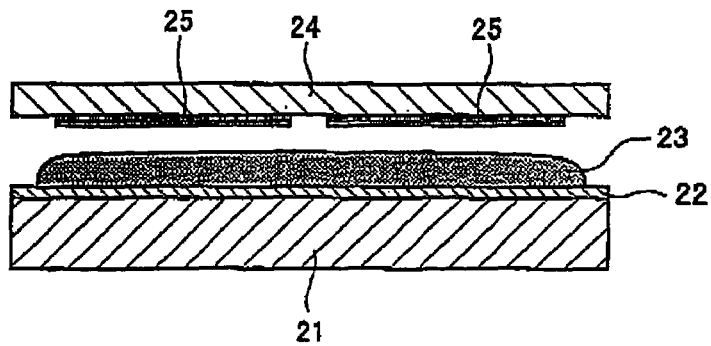
FIG. 3 shows the procedure of assembling the electrostatic chuck.

Hereinafter, embodiments according to the present invention will be explained with reference to the attached drawings. FIG. 1 is a whole view of a plasma processing apparatus in which an electrostatic chuck according to the present invention is incorporated, FIG. 2 is a cross-sectional view of the electrostatic chuck, and FIG. 3 shows the procedure of assembling the electrostatic chuck.

A plasma processing apparatus includes an upper electrode 10 for generating plasma and an electrostatic chuck 20 which are provided within a chamber 1. An introducing port 2 for reactive gas such as $CF_4$ or $O_2$ is provided in the ceiling of the chamber 1, and an exhaust port 3 is connected to a pressure-reducing apparatus.

As for the basic structure of the electrostatic chuck 20, an insulating film 22 is formed on a surface of a metal plate 21 by flame spraying, and a dielectric substrate 24 is bonded onto the insulating film 22 by an insulating adhesive layer 23. The top surface of the dielectric substrate 24 is a surface for mounting a material to be clamped W such as a semiconductor wafer. Electrodes 25 are formed on the lower surface of the dielectric substrate 24. Lead wires 26 for feeding the electrodes penetrate the metal plate and extend below. Incidentally, the lead wires 26 and the metal plate 21 are insulated.

The metal plate 21 is made of metal having excellent heat-transfer efficiency such as an aluminum alloy or copper, and a refrigerant passage 21a is formed inside the metal plate 21. Preferably, the insulating film 22 formed on a surface of the metal plate 21 by flame spraying is made of an inorganic material such as alumina ($Al_2O_3$).

As an example of a method for manufacturing the dielectric substrate 24, alumina ingredient powder having an average particle diameter of 0.1 μm and a purity of 99.99% or more is a main component, titanium oxide ($TiO_2$) of more than 0.2 wt % and 0.6 wt % or less is mixed and crushed, an acrylic binder is added thereto, adjusted, and thereafter granulated by spray drier so as to obtain granulated powder. Next, after CIP (rubber press) or mechanical press forming is performed, it is formed into a predetermined shape, and firing is performed at a reducing atmosphere of 1150-1350° C. Further, HIP processing (Hot Isostatic Pressing) is performed. As the conditions for the HIP processing, Ar gas is 1000 atmosphere or more, and the temperature is 1150-1350° C. which is the same as the firing temperature. With these conditions, it is possible to obtain the dielectric substrate 24 having high density, comprising grains having an average grain size of 2 μm or less, having volume resistivity of $10^8$-$10^{11}$ Ωcm in 20±3° C., and having a relative density of 99% or more.

Incidentally, the above-mentioned average grain size refers to a grain size obtained by the following planimetric method:

First, a photograph of the dielectric substrate is taken with a scanning electron microscope. A circle having an area of (A) is pictured, and the number of grains NG per unit area is obtained from the number of grains nc within the circle and the number of grains ni extending over the circumference based on equation (1).

$$NG=(nc+1/2ni)/(A/m2) \qquad (1)$$

where m is a magnification of the photograph. Since 1/NG is an area of a single grain, the grain size is $2/\sqrt{(\pi NG)}$.

As for the electrodes 25, a conductive film such as TiC or Ti is formed by CVD or PVD after a surface of the dielectric substrate 24 is ground, and a desired electrode pattern is obtained by performing sandblasting or etching to the conductive film.

By using the above-mentioned dielectric substrate having high density, it is possible to improve the plasma-resistance and prevent the roughness of the surface of the electrostatic chuck from being varied without using a dummy wafer.

In order to assemble the electrostatic chuck 20, as shown in FIG. 3, the metal plate 21 on which the insulating film 22 has been formed and the dielectric substrate 24 on which the electrodes 25 has been formed are prepared, and they are bonded to each other by using an insulating adhesive 23 in a state where the insulating film 22 of the metal plate 21 and the electrodes 25 of the dielectric substrate 24 are opposed.

An example of the insulating adhesive 23 includes a silicone resin having a heat transfer coefficient of 1 W/mk or more, preferably 1.6 W/mk or more, in which alumina or aluminum nitride is used as a filler.

Since the electrostatic chuck according to the present invention can be manufactured by a simple process and the size of the grains constructing the dielectric substrate whose surface serves as a clamping surface is small, the plasma resistance is excellent, waferless plasma cleaning can be performed without using a dummy wafer, and thereby the tact time can be reduced. Also, since the heat-transfer efficiency is good, the capability of cooling a wafer can be improved, and the reliability of electrical insulation between the electrode and the metal plate can be improved.

Figure 4A:
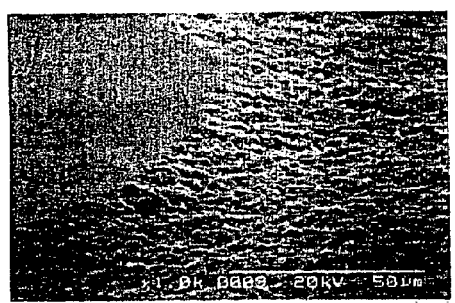
FIG. 4(a) is a photomicrograph of a surface of a dielectric substrate of the electrostatic chuck according to the present invention before being exposed to plasma and FIG. 4(b) is a photomicrograph of a surface of a dielectric substrate of a conventional electrostatic chuck before being exposed to plasma.
Figure 4B:
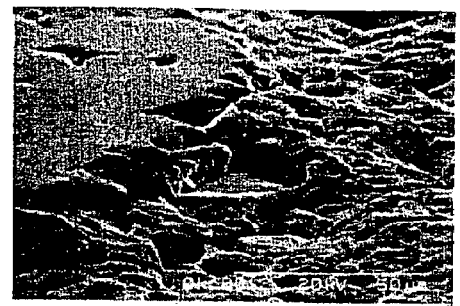
Figure 5A:
FIG. 5(a) is a photomicrograph of a surface of a dielectric substrate of the electrostatic chuck according to the present invention after being exposed to plasma and FIG. 5(b) is a photomicrograph of a surface of a dielectric substrate of a conventional electrostatic chuck after being exposed to plasma.
Figure 5B:
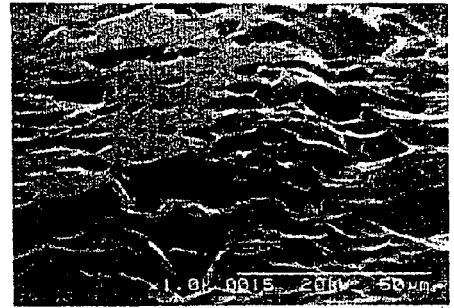

Specifically, FIG. 4(a) is a photomicrograph of a surface of the dielectric substrate of the electrostatic chuck according to the present invention before being exposed to plasma and FIG. 4(b) is a photomicrograph of a surface of the dielectric substrate of a conventional electrostatic chuck before being exposed to plasma, and FIG. 5(a) is a photomicrograph of a surface of the dielectric substrate of the electrostatic chuck according to the present invention after being exposed to plasma and FIG. 5(b) is a photomicrograph of a surface of the dielectric substrate of a conventional electrostatic chuck after being exposed to plasma.

Figure 6:
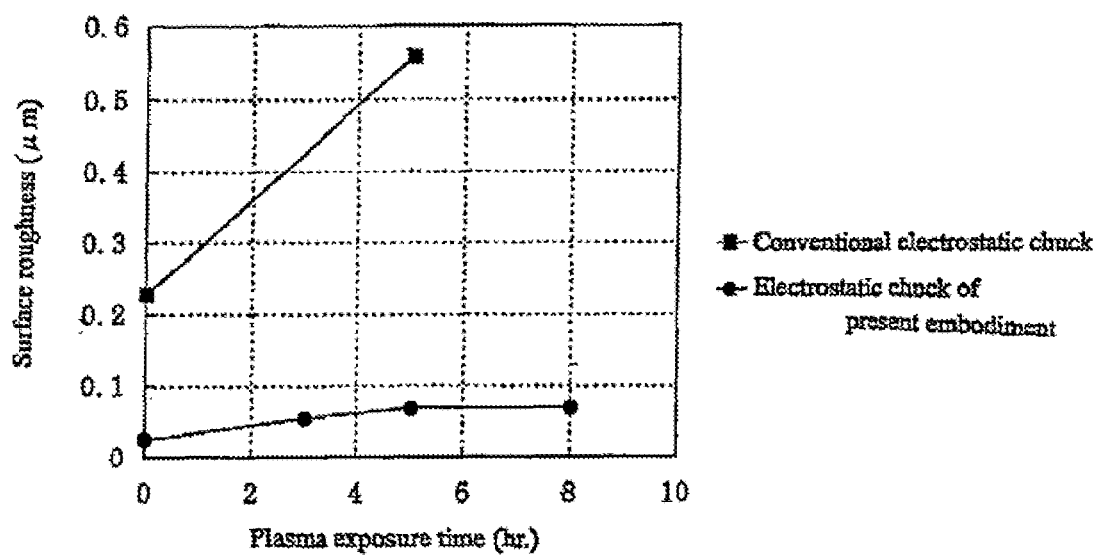
FIG. 6 shows variation in the surface roughness when the surface of the dielectric substrate of the electrostatic chuck according to the present invention was exposed to plasma and the surface of the dielectric substrate of the conventional electrostatic chuck was exposed to plasma.
Figure 7:
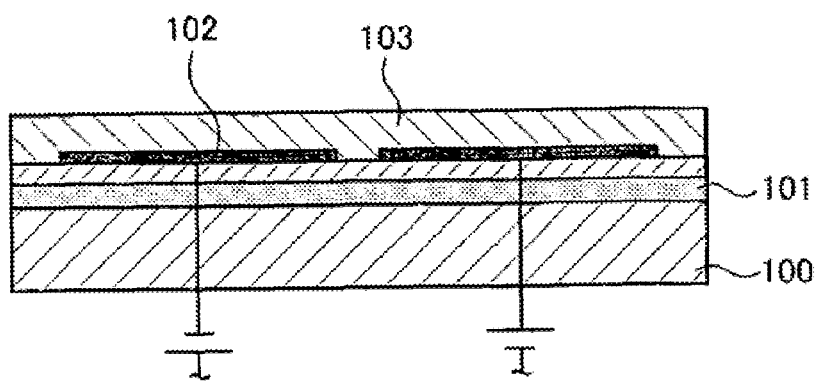
FIG. 7 is a cross-sectional view of the conventional electrostatic chuck.

FIG. 6 shows variation in the surface roughness of the dielectric substrate of the electrostatic chuck according to the present invention and the dielectric substrate of the conventional electrostatic chuck.

Clearly seen from these photomicrographs and drawing, the variation in the surface roughness (Ra) before and after being exposed to plasma is extremely small with respect to the surface of the dielectric substrate of the electrostatic chuck according to the present invention.

What is claimed is:

1. An electrostatic chuck comprising:
   a metal plate;
   an electrical insulating film comprised of an inorganic material and formed on a surface of the metal plate by flame spraying;
   a ceramic dielectric substrate; and
   an electrode which is formed on a select portion of a surface of the ceramic dielectric substrate,
   wherein the metal plate and the ceramic dielectric substrate are bonded to each other by an insulating adhesive such that the insulating film and the electrode are opposed,
   wherein the electrical insulating adhesive is interposed between the electrical insulating film and the surface of the ceramic dielectric substrate including the electrode and substantially completely covers the surface of the ceramic dielectric substrate including the electrode, and
   wherein a heat transfer coefficient of the electrical insulating adhesive is $\geqq 1$ W/mk.

2. The electrostatic chuck according to claim 1, wherein the average size of grains of the dielectric substrate is 2 μm or less.

3. The electrostatic chuck according to claim 1, wherein the total thickness of the dielectric substrate, the insulating adhesive, and the insulating film is in the range of 0.5-2.0 mm.

4. The electrostatic chuck according to claim 1, wherein the electrical insulating adhesive comprises silicone resin.

5. The electrostatic chuck according to claim 1, wherein the electrical insulating adhesive comprises silicone resin and at least one of alumina and aluminum nitride as filler in the silicone resin.

6. The electrostatic chuck according to claim 1, wherein the electrical insulating adhesive is interposed between the electrical insulating film and the surface of the ceramic dielectric substrate where the electrode is not formed.

7. The electrostatic chuck according to claim 1, wherein another electrode is formed on another select portion of the surface of the ceramic dielectric substrate, and the electrical insulating adhesive is interposed between said electrodes.

8. The electrostatic chuck according to claim 1, wherein the electrode is formed by depositing a conductive film on the surface of the ceramic dielectric substrate and then defining a pattern in the conductive film by performing sandblasting or etching thereon.

9. An electrostatic chuck constructed by the process of:
   a) providing a metal plate and a ceramic dielectric substrate,
   b) forming an electrical insulating film comprised of an inorganic material on a surface of said plate by flame spraying,
   c) forming an electrode on a select portion of a surface of the ceramic dielectric substrate,
   d) bonding the metal plate and the ceramic dielectric substrate with an electrical insulating adhesive such that the electrical insulating film and the electrode are opposed and the insulating adhesive substantially completely covers the surface of the ceramic dielectric substrate including the electrode,
   wherein the electrical insulating adhesive has a heat transfer coefficient of $\geqq 1$ W/mk.

10. The electrostatic chuck according to claim 9, wherein the average size of grains of the dielectric substrate is 2 μm or less.

11. The electrostatic chuck according to claim 9, wherein the total thickness of the dielectric substrate, the insulating adhesive, and the insulating film is in the range of 0.5-2.0 mm.

12. The electrostatic chuck according to claim 9, wherein the electrical insulating adhesive comprises silicone resin.

13. The electrostatic chuck according to claim 9, wherein the electrical insulating adhesive comprises silicone resin and at least one of alumina and aluminum nitride as filler in the silicone resin.

14. The electrostatic chuck according to claim 9, wherein the electrical insulating adhesive is interposed between the electrical insulating film and the surface of the ceramic dielectric substrate where the electrode is not formed.

15. The electrostatic chuck according to claim 9, wherein another electrode is formed on another select portion of the surface of the ceramic dielectric substrate, and the electrical insulating adhesive is interposed between said electrodes.

16. The electrostatic chuck according to claim 9, wherein the electrode is formed by depositing a conductive film on the surface of the ceramic dielectric substrate and then defining a pattern in the conductive film by performing sandblasting or etching thereon.

\* \* \* \* \*

UNITED STATES PATENT AND TRADEMARK OFFICE
CERTIFICATE OF CORRECTION

| | | |
|---|---|---|
| PATENT NO. | : 7,468,880 B2 | |
| APPLICATION NO. | : 11/299802 | |
| DATED | : December 23, 2008 | |
| INVENTOR(S) | : Itakura et al. | |

It is certified that error appears in the above-identified patent and that said Letters Patent is hereby corrected as shown below:

Title page:

Item (75), "Inventors:", change "Syouichiro" to --Shoichiro--.
Item (74), After "*Primary Examiner*" change "Ronald W Leja" to --Ronald W. Leja--.

Drawings:

On sheet 3 of 3, Fig. 6, change the y-axis label from "Surface roughness ($\mu$m)" to --Surface roughness Ra ($\mu$m)--, in accordance with the original Japanese version of Fig. 6 that was filed in the U.S. application.

Column 2:

Line 30, after "metal plate" insert a comma.
Line 61, change "electrode and between" to --electrode, and between--.
Line 66, change "or less so as to" to --or less, so as to--.

Column 3:

Line 11, change "invention before being exposed to plasma and" to --invention, before being exposed to plasma; and--.
Line 17, change "invention after being exposed to plasma and" to --invention, after being exposed to plasma; and--.
Line 23, change "exposed to plasma and" to --exposed to plasma, and when--.

UNITED STATES PATENT AND TRADEMARK OFFICE
CERTIFICATE OF CORRECTION

PATENT NO. : 7,468,880 B2
APPLICATION NO. : 11/299802
DATED : December 23, 2008
INVENTOR(S) : Itakura et al.

It is certified that error appears in the above-identified patent and that said Letters Patent is hereby corrected as shown below:

Column 4:

Line 38, change "has been formed" to --have been formed--.
Line 62, change "plasma, and FIG. 5(*a*)" to --plasma; FIG. 5(*a*)--.

Signed and Sealed this

Twenty-first Day of April, 2009

JOHN DOLL
*Acting Director of the United States Patent and Trademark Office*